United States Patent [19]
Lee

[11] Patent Number: 6,037,640
[45] Date of Patent: Mar. 14, 2000

[54] ULTRA-SHALLOW SEMICONDUCTOR JUNCTION FORMATION

[75] Inventor: Kam Leung Lee, Putnam Valley, N.Y.

[73] Assignee: International Business Machines Corporation, Armonk, N.Y.

[21] Appl. No.: 09/076,563

[22] Filed: May 12, 1998

Related U.S. Application Data

[62] Division of application No. 08/968,684, Nov. 12, 1997.

[51] Int. Cl.$^7$ .................................................. H01L 29/76
[52] U.S. Cl. .......................... 257/408; 257/344; 257/345
[58] Field of Search .................................. 257/408, 344, 257/345

[56] References Cited

U.S. PATENT DOCUMENTS

| | | |
|---|---|---|
| 5,254,484 | 10/1993 | Hefner et al. . |
| 5,355,011 | 10/1994 | Takata ...................................... 257/408 |
| 5,384,279 | 1/1995 | Stolmeijer et al. . |
| 5,512,470 | 4/1996 | Hong ....................................... 257/345 |
| 5,895,954 | 4/1999 | Yasumura et al. ....................... 257/345 |
| 5,897,363 | 4/1999 | Gonzalez et al. ........................ 438/527 |

OTHER PUBLICATIONS

1. T. H. Huang, et al., "Influence of Fluorine Preamorphization on the Diffusion and Activation of Low–Energy Implanted Boron During Rapid Thermal Annealing," Appl. Phys. Lett., vol. 65, No. 14, pp. 1829–1831 (1994).
2. S. Saito, et al., "Defect Reduction by MeV Ion Implanation for Shallow Junction Formation," Appl. Phys. Lett., vol. 63, No. 2, pp. 197–199 (1993).
3. Somnath Nag, et al., "Shallow Trench Isolation for Sub–0.25–um IC Technologies," Solid State Technology, pp. 129–136, (1997).

*Primary Examiner*—Sheila V. Clark
*Assistant Examiner*—H. D. Tran
*Attorney, Agent, or Firm*—Scully, Scott, Murphy & Presser

[57] ABSTRACT

A method for fabricating an ultra-shallow semi-conductor junction using a high energy co-implantation step; a low energy dopant implantation step, and a fast isothermal annealing step is provided. Microelectronics devices such as FET and CMOS devices containing said ultra-shallow semiconductor junction is also provided herein.

9 Claims, 7 Drawing Sheets

ULTRA-SHALLOW SEMICONDUCTOR JUNCTION FORMATION

RELATED APPLICATION

This application is a divisional of U.S. application Ser. No. 08/968,684, filed Nov. 12, 1997.

FIELD OF THE INVENTION

The present invention relates to microelectronics and, in particular, to a method of fabricating an ultra-shallow junction in Field Effect Transistor (FET) devices, such as Complementary Metal Oxide Semiconductor (CMOS) devices.

BACKGROUND OF THE INVENTION

Advances in the miniaturization of CMOS devices have been a key driving force behind the explosive growth of various network centric computing products such as ASIC high speed microprocessors and memories, low power hand-held computing devices, cable modems and advanced multimedia audio and video devices. Smaller CMOS devices typically equate to faster switching times which led to speedier and better performing end user systems.

The process of miniaturizing CMOS devices involves scaling down various horizontal and vertical dimensions in the CMOS device structure. In particular, the thickness of the ion implanted source/drain junction of a p- or n-type transistor is scaled down with a corresponding scaled increase in the substrate channel doping. In this manner, constant electric field is maintained in the transistor channel which results in higher speed performance for the scaled down CMOS transistor. For example, for a 0.1 $\mu$m CMOS device, the source/drain extension junction closest to the transistor channel is as shallow as 50 nm and has a channel doping concentration as high as $1\times10^{18}/cm^3$.

Figure 1A:
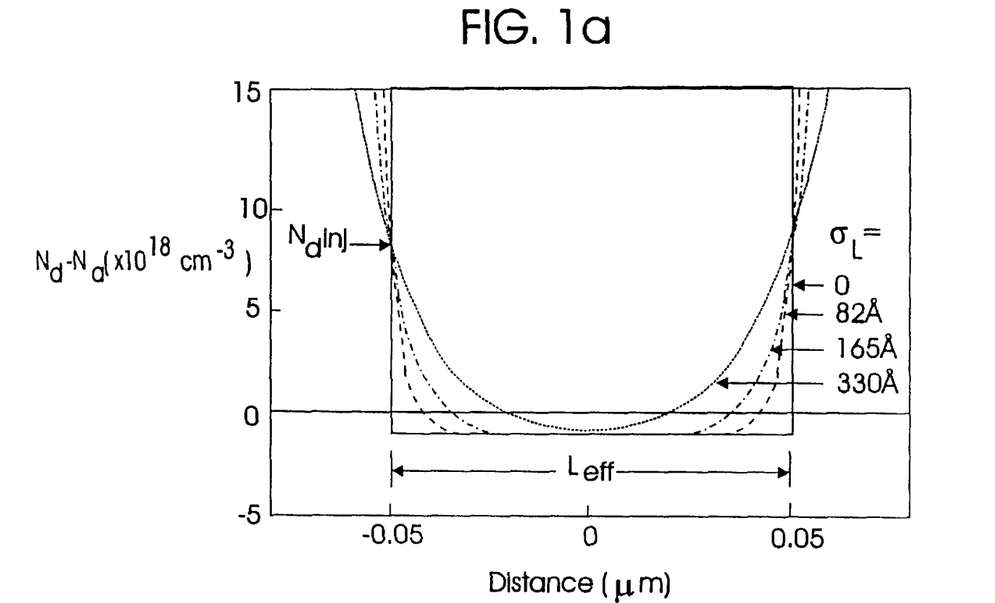
FIG. 1(a) is plot of net doping concentration ($N_d$–$N_a$) ($\times 10^{18}$/cm$^3$) vs distance ($\mu$m) along the channel.
Figure 1B:
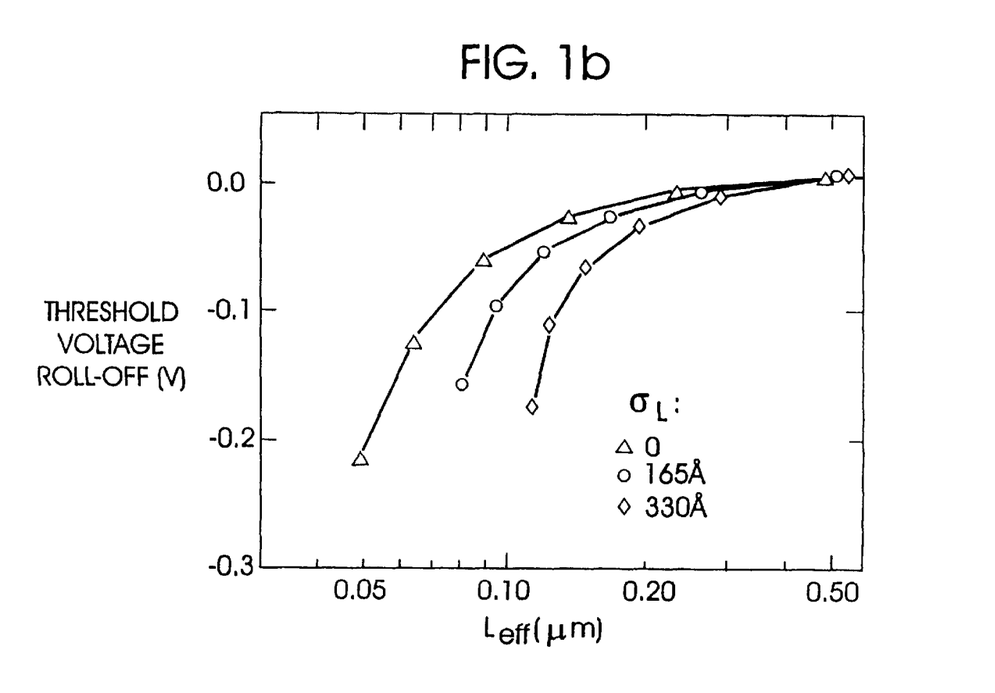
FIG. 1(b) is a plot of the threshold voltage roll-off (V) vs $L_{eff}$ ($\mu$m)

For CMOS devices with a critical gate dimension below 0.25 $\mu$m, a shallow junction is not the only requirement. A more important requirement, in the source/drain extension junction, is the abruptness of the junction/dopant profile slope which is in proximity to the transistor channel. As shown in FIG. 1(a), there is more penetration of the source/drain dopant into the transistor channel as the junction/profile slope becomes less abrupt. This results in poor threshold voltage roll-off characteristics for sub-quarter micron CMOS devices (See, for example, FIG. 1(b)). Thus, for small advanced CMOS devices, it is vital for the source/drain extension junction profile to be shallow, abrupt and have a high surface concentration.

The formation of source/drain extension junctions in CMOS devices is commonly carried out in the prior art by ion implantation in appropriately masked source/drain regions of a silicon substrate with boron (p-type) or arsenic and phosphorous (n-type) dopants. To minimize ion channeling during ion implantation, which will broaden the implanted profile, the silicon substrate is usually preamorphized with heavy ions such as Ge or Si. Preamorphization of silicon is a process in which sufficient ion dose is used to convert the surface region of the Si substrate from crystalline to amorphous. The depth of the converted amorphous region depends on the nature of the ions, ion energy and the dose of the incident ions on the silicon substrate. Although the preamorphization process helps to sharpen the implanted profile and improve the epitaxial silicon regrowth process during subsequent thermal annealing, it also creates extensive crystal damage and excess Si interstitials at the End of Range (EOR) of the preamorphized ions. As is known to those skilled in the art, Si interstitials are displaced Si atoms created by ion bombardment of the crystalline Si substrate. During thermal annealing, the presence of these EORs is detrimental since excess Si interstitials greatly enhance (10 to 1000 times) the normal diffusion of dopants through the Si substrate and result in a much deeper source/drain junction and poorer junction profile.

This greatly enhanced diffusion of dopants due to the presence of excess Si interstitials around the dopant atoms is commonly referred to in the prior art as transient enhanced diffusion (TED). In particular, the relatively high diffusivity of small boron dopants in combination with ion channeling and transient diffusion makes the fabrication of small p-type CMOS devices difficult. The aforementioned combination also represents a major hurdle that needs to be overcome before further miniaturization of the CMOS device technology can occur.

Several prior art approaches have attempted to reduce the transient enhanced diffusion for shallow junction formation. In one approach, a carbon co-implant was used to reduce the transient diffusion of boron dopant during rapid thermal anneal (RTA). The conditions employed in forming the shallow junction using carbon co-implantation were as follows: 2 keV boron shallow implant, dose $1\times10^{15}/cm^2$, carbon implant (energy not reported), dose=$2\times10^{14}/cm^2$. Rapid thermal anneal (RTA) conditions were 950° C., 30 seconds, or 1050° C., 30 seconds, respectively. Although carbon co-implant is effective in reducing the transient diffusion of boron, this method suffers from the disadvantage that high density of residual defects remain after RTA. This is the case even using high temperature anneal conditions (1050° C., 30 seconds). The high density of residual defects results in high electrical leakages for the shallow junction.

Another approach reported by T. H. Huang et al. ("Influence of Fluorine Preamorphization on the Diffusion and Activation of Low-energy Implanted Boron during Rapid Thermal Anneal," *Appl. Phys. Lett.*, (1994) Vol. 65, No. 14, p. 1829) used fluorine co-implants to reduce the transient diffusion of boron dopants during rapid thermal anneals. The conditions used in this reference for shallow junction formation are as follows: fluorine implant, 40 keV ion energy, dose=$2\times10^{15}/cm^2$, 5 keV boron or 23 keV $BF_2$ shallow implants. In the process disclosed by Huang et al., the wafers were rapid thermal annealed at 1000° C., 1050° C. and 1100° C. for 30 seconds. Although the presence of fluorine implants reduced the transient boron enhanced diffusion during RTA, this prior art method also suffers from the disadvantage that residual defects remain after 1000° C., 30 seconds anneal. Residual defects can only be removed with 1100° C., 30 seconds anneal. However, substantial dopant motion occurs at this higher temperature and therefor ultra-shallow junctions cannot be formed.

Another approach reported by S. Saito entitled "Defect Reduction by MeV Ion Implantation for Shallow Junction Formation," *Appl. Phys. Lett.*, (1993) Vol. 63, No. 2, p. 197 used fluorine implants for preamphorization (40 keV, $1\times10^{15}/cm^2$), shallow implant; boron at 10 keV and $5\times10^{15}/cm^2$. This was followed by ion implantation of either fluorine or silicon at 1 MeV energy or arsenic at 2 MeV energy. The dose used for the MeV implant was between $5\times10^{14}$ to $5\times10^{15}/cm^2$. The samples were rapid thermal annealed at 1000° C. or 1100° C. for 110 seconds. Under these experimental conditions, Saito demonstrated that the MeV implants were effective in reducing the boron transient diffusion with and without fluorine preamphorization. This reference also demonstrated that maximum reduction in boron dopant diffusion was achieved when both fluorine preamorphization and Mev fluorine implants were used. However, as mentioned in the prior art earlier, use of fluorine implants creates residual defects and requires temperatures as high as 1100° C. for low leakage junction to be formed.

In each of the prior art references mentioned hereinabove, high energies were used to implant boron (2 to 10 keV) or $BF_2$ (23 keV) into semiconductor materials. These energy ranges are however unsuitable to create an ultra-shallow boron dopant junction below 50 nm. All the junction depths created by the prior art techniques are between 60–100 nm. Although the combination of high temperature (>1000° C.) and long annealing times (10 to 30 seconds) minimize residue defects due to carbon or fluorine co-implants, it inhibits the formation of ultra-shallow junctions. Moreover, all of the prior art techniques overlook the importance of the rate at which the wafer reaches the desired anneal temperature, i.e., 1000° to 1100° C., as well as ramp down rate for the wafer to cool down from the anneal temperature.

Despite the current advances made in the field of microelectronics, there is still a need for providing a new and improved method which provides an ultra-shallow junction in FET devices while overcoming all of the drawbacks mentioned hereinabove.

SUMMARY OF THE INVENTION

One object of the present invention is to provide a method of fabricating ultra-shallow junctions in microelectronic devices.

Another object of the present invention is directed to providing a method wherein all of the aforementioned drawbacks of the prior art processes have been overcome.

A further object of the present invention is to provide a method wherein the resultant microelectronic device has a shallow extension junction whose boundaries exhibit a sharp change in dopant concentration.

These as well as other objects and advantages are achieved by the method of the present invention wherein an ultra-shallow junction is formed in a semiconductor material by using a high energy ion implantation step followed by low energy implantation of a dopant ion and subsequent annealing. Specifically the present invention relates to a method of forming an ultra-shallow junction in a semiconductor material comprising the steps of:

(a) irradiating a surface of a semiconductor material with a first ion at a first irradiation energy sufficient to implant said first ion to a first depth;

(b) irradiating said semiconductor surface with a dopant ion at a second irradiation energy sufficient to implant said dopant ion to a second depth that is less than said first depth of said first ion; and (c) heating said semiconductor material under conditions effective to cause substantial annealing of said dopant ion within said semiconductor material and for a period of time to prevent substantial diffusion of said dopant ion to a depth greater than said second depth.

According to a preferred embodiment of the present invention, and prior to conducting step (b), the semiconductor surface is irradiated with a second ion at a third irradiation energy which is sufficient to render said semiconductor material substantially amorphous and to a third depth greater than said second depth and less than said first depth.

Another preferred embodiment of the instant invention comprises forming a thin layer of amorphous insulator material on said surface of said semiconductor material. When this embodiment of the present invention is carried out, it typically occurs prior to conducting step (a) or (b).

In yet another embodiment of the present invention, step (b) may precede step (a). That is, the present method may be carried out by conducting step (b) before step (a), i.e., by irradiating with the dopant ion first, followed by irradiating with a high energy deep implant of the first ion.

Preferably, the semiconductor material is silicon and the first irradiation energy, for the high energy deep implant, is between about 200 keV and about 2000 keV, and the second irradiation energy, for shallow dopant implantation is between about 100 eV to about 5 keV.

In another aspect of the present invention, a structure useful in fabricating microelectronic devices such as a FET or CMOS device is provided. In accordance with this aspect of the present invention, a structure having an abrupt p-n junction is disclosed. The structure comprises a shallow implant region defined by dopant material of a first conductivity type formed in the surface of a semiconductor substrate of a second conductivity type, said semiconductor substrate comprises a region of coalesced high concentration of interstitial first ions disposed substantially at a first depth, said shallow implant region having a second depth less than said first depth wherein the concentration of said dopant ion at a boundary junction of said shallow implant region within said semiconductor substrate changes by a factor of 10 within a distance of less than 60 Å measured at, and perpendicular to, said boundary.

A field effect transistor comprising a micro-electronic device having a source region and a drain region formed in mutually spaced adjacency in said surface of a semiconductor substrate having a pair of said shallow implant regions being disposed between and formed as spaced-apart extensions of source and drain regions to form a channel region between the spaced-apart shallow implant regions, and a gate electrode overlying said channel region is also provided herein.

DETAILED DESCRIPTION OF THE INVENTION

The present invention which provides a method of fabricating microelectronic structures and devices having an ultra-shallow junction will now be described in detail with reference to the accompanying drawings wherein like reference numerals are used for like and corresponding elements of the drawings. It is noted that the term "ultra-shallow" denotes a junction that has a depth of about 50 nm or less. More preferably, the junction formed by the instant invention has a depth of from about 10 to about 45 nm.

Figure 2A:
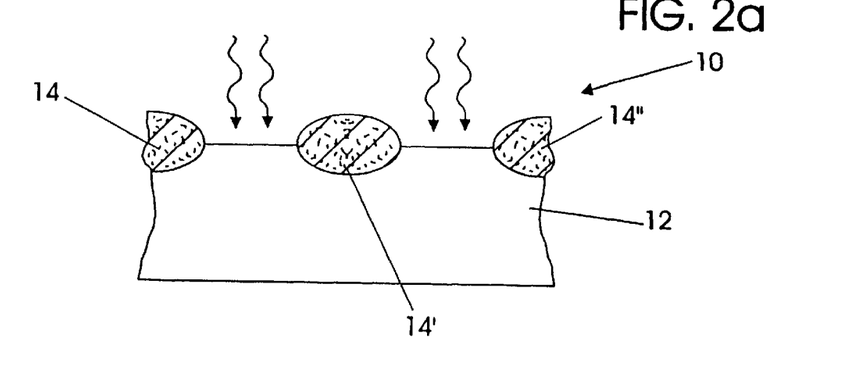
FIGS. 2(a)–2(e) show various embodiments of the semiconductor material employed in the present invention.

Referring first to FIG. 2(a), there is shown a semiconductor material 10 which is subjected to irradiation with a first ion under conditions sufficient to implant said first ion to a first depth in semiconductor material 10.

As is shown in FIG. 2(a), semiconductor material 10 contains a semiconductor substrate 12 and oxide isolation regions 14, 14' and 14". Semiconductor substrate 12 is composed of conventional semiconductor materials which are typically employed in forming microelectronic devices. Examples of such semiconductor substrates include, but are not limited to, silicon, germanium, gallium arsenide, silicon germanium or mixtures thereof. A highly preferred material for semiconductor substrate 12 is silicon.

The oxide isolation regions are formed in the surface of semiconductor substrate 12 using conventional techniques well known to those skilled in the art. Examples of forming oxide isolation regions in semiconductor substrate 12 include, but are not limited to, thermal oxidation or chemical vapor deposition.

Figure 3:
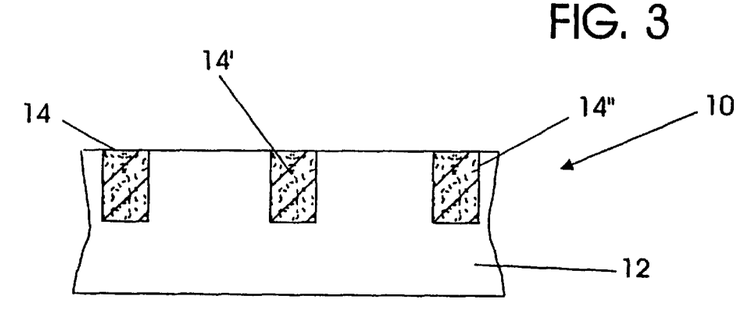
FIG. 3 shows an alternative semiconductor material containing shallow trench oxide isolation regions between the active device region that can be employed in the present invention.

Alternatively, semiconductor material 10 may comprise semiconductor substrate 12 that has shallow trench oxide isolation regions 14, 14' and 14" formed therein. Such a structure is shown in FIG. 3. Specifically, this structure is formed by using conventional means as described, for example, in Nag, et al. "Shallow trench isolation for sub 0.25 μm IC technology," *Solid State Technology*, September 1997, pp. 129–136. This includes the steps of: growing a thermal oxide layer on a semiconductor material, providing a nitride layer to said thermal oxide layer, etching said structure to provide trenches in the semiconductor material, depositing a thermal oxide liner layer in said trenches, depositing an oxide material in said trenches and planarizing the structure.

Although the description to follow is related to the semiconductor material shown in FIG. 2(a), it is emphasized that it also would pertain equally to the structure shown in FIG. 3.

Figure 2B:
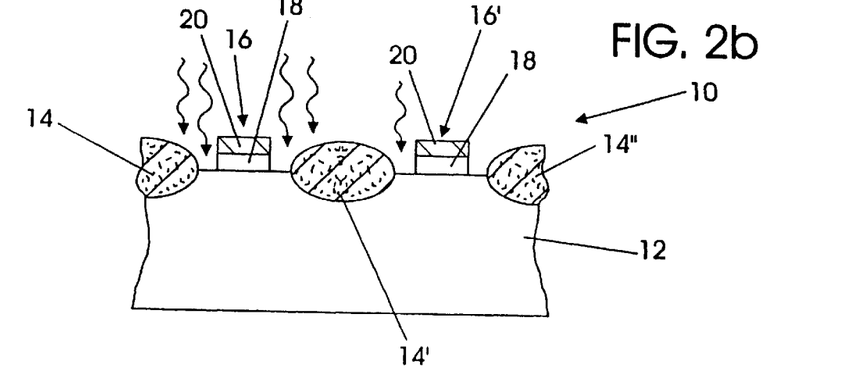

Gates 16 and 16' in the action device region, shown in FIG. 2(b), may be present on the surface of the semiconductor substrate prior to conducting any steps of the present invention. Gates 16 and 16' are composed of an insulating material 18 and a conductor material 20. Suitable insulating materials include, but are not limited to, $SiO_2$, $Si_3N_4$, $TiO_2$, $Al_2O_3$ and the like. Mixtures of these insulating materials are also contemplated herein. Conductor 20, forming gates 16 and 16', includes conventional conductor materials such as polysilicon, W, Cr, Cu, and the like. It is emphasized that if the gates are not present on the surface of the semiconductor material prior to fabricating the ultra-shallow junction, they may be formed after the annealing step of the present invention using conventional methods well known to those skilled in the art.

Prior to providing the oxide isolation regions or the trench oxide isolation regions on semiconductor substrate 12, the surface of the semiconductor substrate may be cleaned to remove any surface contaminants that may exist thereon. While any cleaning method known to those skilled in the art may be employed in the present invention, it is preferred that a Huang clean be used.

As stated hereinabove, a first ion is implanted into the surface of semiconductor substrate 12 using high energy implantation. Suitable first ions that may be implanted by high energy implantation are Si, Ge, As, In, Ga and the like. The first ion may be the same or different from the semiconductor substrate. A highly preferred first ion used in this step of the present invention is Si. It is noted that the first ion implanted into the semiconductor substrate creates damaged regions, i.e., defects, in the semiconductor substrate.

The first ion is implanted into the semiconductor substrate using a conventional ion implantation apparatus that operates at high energies. By "high energies" it is meant that the ion implantation is carried out at an energy of from about 200 to about 2000 keV. More preferably, the first ion is implanted at an energy of from about 500 to about 1000 keV. The dosage, i.e., concentration, of the first ion implanted by this high energy implantation step is, typically, of from about $1\times10^3/cm^2$ to about $1\times10^{16}/cm^2$. More preferably, the first ion dose is from about $1\times10^{14}/cm^2$ to about $1\times10^{15}/cm^2$. The high energy ion implantation step is carried out at a temperature of from about −200° to about 23° C. Using the above defined parameters, the first ion is implanted to a depth of from about 0.2 to about 2.0 μm. More preferably, the first ion is implanted to a depth of from about 0.5 to about 1.0 μm.

When the surface of the semiconductor material is first doped with a heavy ion, i.e., preamorphized, the semiconductor material is treated prior to the low energy dopant implantation step to remove screen or native oxides in the active device region using conventional techniques well known to those skilled in the art. One way of removing the oxides is by treating the semiconductor material with dilute hydrofluoric acid. This embodiment of the present invention is not illustrated in the drawings.

In the next step of the present invention, a dopant ion is implanted into the surface of the semiconductor material by using a low energy ion implantation step which is conducted under conditions that are effective to implant said dopant ion to a depth less than the high energy implanted first ion. The dopant ion employed in this step of the present invention depends on the type of junction being formed. For example, if a p-type junction is being formed, the dopant ion is boron. When a n-type junction is being formed the dopant ion is As, P or Sb. The source of the dopant ion is usually in the form of a molecular complex ion derived from $BF_2$, $B_{10}H_{14}$ or $As_2$ gas sources.

This low energy dopant ion implantation step is conducted using an ion implantation apparatus that operates at low energies of from about 100 eV to about 5 keV. More preferably, the low energy dopant ion implantation step is carried out at energy range of from about 200 eV to about 1 keV. The dosage of dopant ions implanted in this step of the present invention is in the range from about $1\times10^{13}/cm^2$ to about $1\times10^{15}/cm^2$, more preferably from about $1\times10^{14}/cm^2$ to about $1\times10^{15}/cm^2$. This low energy dopant ion implantation step is carried out at a temperature of from about −200° to about 23° C.

Using the above defined parameters, the dopant ion is implanted to a depth which is shallower than that of the first implanted ion. Specifically, the dopant ion is implanted to a depth of from about 10 to about 500 Å. More preferably, the dopant ion is implanted to a depth of from about 10 to about 250 Å.

It is noted that the above steps of high energy ion implantation and low energy dopant ion implantation may be conducted in any order. That is, the steps may be conducted in the manner indicated above, or, in an alternative embodiment, the low energy dopant ion implantation step may occur before the high energy ion implantation step.

Figure 2C:
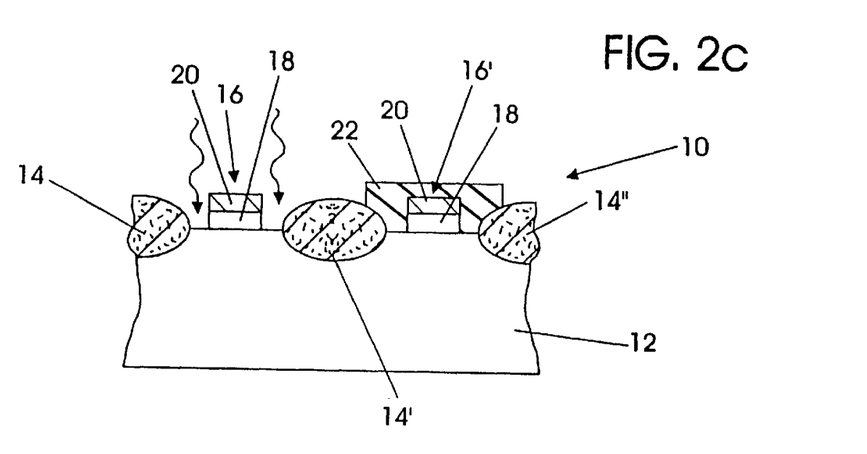

When gate regions 16 and 16' are present on the active device area of the semiconductor material, the active device area between the oxides isolation regions may be covered with a conventional resist block mask 22 prior to low energy ion implantation. After low energy implantation of a particular dopant ion (n-or p-type), the resist mask is removed by conventional methods and then the area containing the low energy implanted dopant ion is covered as before and the uncovered area is irradiating with a dopant ion different from the first region. This is shown in FIGS. 2(c) and (c'), respectively.

In another aspect of the present invention, a second ion is implanted into the surface of the semiconductor substrate using a third irradiation energy which is effective to render the semi-conductor material substantially amorphous. When such a preamorphized step is employed, it typically is conducted prior to implanting the dopant ion. The second ion is typically a heavy ion such as, but not limited to, Ge, Si and the like. A highly preferred ion for preamorphization is Ge.

The conditions used in this preamorphization step are sufficient to implant said second ion to a depth greater than said dopant ion but less than the depth of the first ion. Specifically, the preamorphization step is conducted at an energy of from about 2 to about 40 keV, an ion dosage of from about $1 \times 10^{13}/cm^2$ to about $5 \times 10^{15}/cm^2$, and at a temperature of from about $-200°$ to about $23°$ C.

Using the above defined conditions, the second ion may be implanted to a depth of from about 100 to about 1000 Å, more preferably from about 150 to about 500, Å.

In another aspect of the present invention, a thin, amorphous insulating layer may be deposited on the surface of the semiconductor material prior to conducting the implantation steps using conventional techniques well known to those skilled in the art, e.g. thermal oxidation or chemical vapor deposition. The insulating materials used in this step of the present invention are the same as those mentioned hereinabove in forming the gate regions. Typically, the thickness of the insulating layer deposited is from about 10 to about 70 Å. More preferably, the thickness of insulating material is from about 15 to about 50 Å.

After conducting the various implantation steps mentioned hereinabove, the semiconductor material is subjected to heating under conditions which are effective to cause substantial annealing of the dopant ion and for a period of time which is sufficient to prevent diffusion of the dopant ion to a depth greater than its initial implantation depth. In order to obtain this result, a rapid thermal anneal (RTA) process with high ramp-up and ramp-down rates are employed. Specifically, the semiconductor material is heated in an inert gas atmosphere from room temperature to a temperature of from about 850° to about 1100° C. at a ramp-up rate of from about 50° to about 1000° C./sec. More preferably, the semiconductor material is heated from room temperature to a temperature of from about 950° to about 1050° C. at a ramp-up rate of from about 50° to about 500° C./sec.

After the desired temperature is achieved, the temperature is held for a time period of from about 1 milliseconds to about 5 seconds, and more preferably, from about 10 milliseconds to about 5 second. Once the desired holding time has elapsed, the semiconductor material is then cooled down to room temperature at a ramp-down rate of from about 50° to about 1000° C./sec. More preferably, the cooling rate is from about 50° to about 500° C./sec.

The above described RTA step is carried out using an apparatus containing, for example, a halogen lamp, an arc lamp, a $CO_2$ laser or a microwave cavity or gyratron. A stationary furnace containing prescribed heating zones could also be used provided that the furnace contains a means for rapidly transferring the semiconductor material along said heating zones.

Figure 2D:
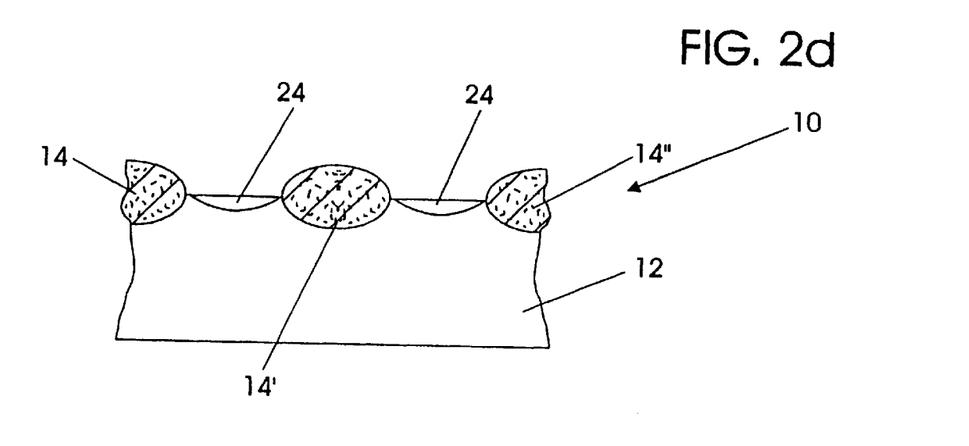
Figure 2E:
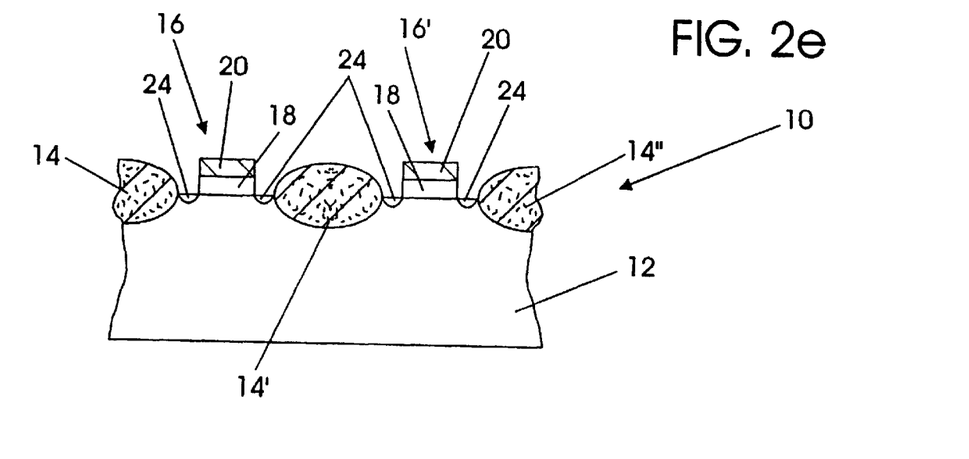

The final structure achieved by the present invention containing an ultra-shallow junction is shown in FIGS. 2(d) and 2(e). In both of these figures, the ultra-shallow junction is denoted as 24. It is noted that the depth of the junction formed from the above method is much shallower than the depth of junctions formed by prior art processes. Moreover, the junctions of the present invention exhibit an abrupt change in the slope of the dopant profile at the shallow junction.

Figure 4:
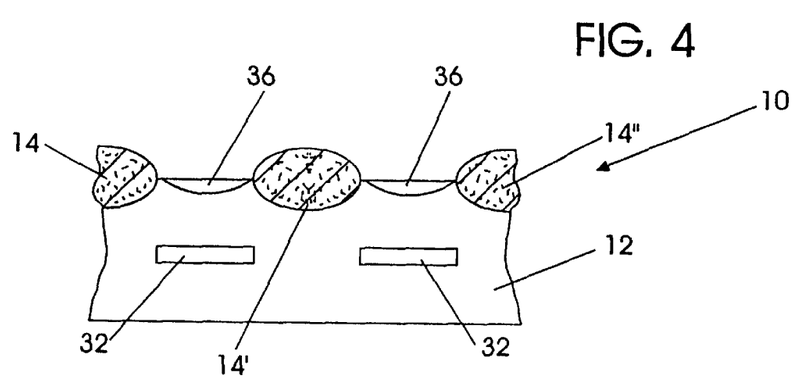
FIG. 4 is a cross-sectional view of a semiconductor structure having an ultra-shallow junction prepared in accordance with the present invention.

As mentioned above, the instant application also provides structures which are useful in fabrication of microelectronic devices, such as FET or CMOS, which contain an ultra-shallow junction. One such structure is shown in FIG. 4. Specifically, the structure shown in FIG. 4 comprises a shallow implant region 36 formed in the surface of semiconductor substrate 12. The semiconductor material comprising a region 32 of coalesced high concentration of interstitial first ions disposed at a first depth. The shallow implant region 36 has a second depth less than the depth of said first ion and the concentration of the dopant ions in said shallow implant region are such that the boundary junction of said shallow implant region 36 with said semiconductor substrate 12 changes by a factor of 10 within a distance of less than 60 Å, measured at, and perpendicular to, the boundary.

In the above structure, the second depth is typically less than 500 Å; the change in concentration of said dopant material at the boundary junction is about $1 \times 10^{18}/cm^2$; and the first ion depth is about 10,000 Å.

Figure 5:
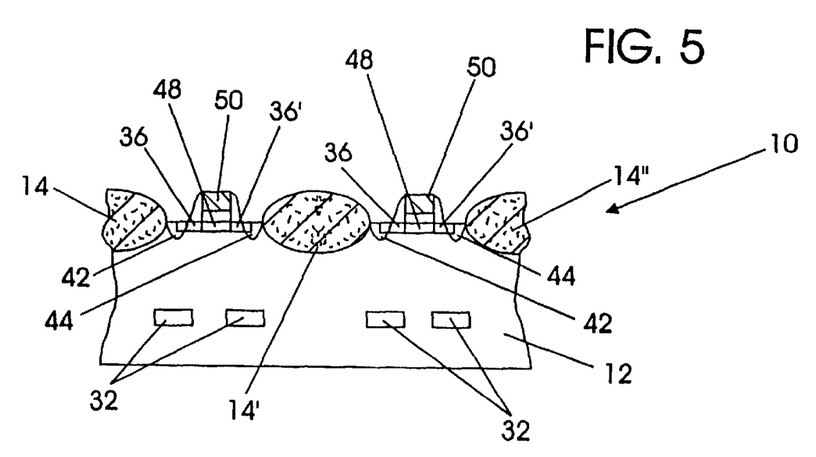
FIG. 5 is a cross-sectional view of a FET device having ultra-shallow source and drain regions.

A device that can be fabricated by the instant invention is shown in FIG. 5. Specifically, FIG. 5 depicts a FET device comprising a microelectronic device having a source region 42 and a drain region 44 formed in mutually spaced adjacency in the surface of semiconductor substrate 12. Semiconductor substrate 12 also contains regions 32 of coalesced high concentration of interstitial first ions disposed at a first depth. A pair of shallow implant regions, 36 and 36' respectively, are disposed between and formed as spaced apart extensions of source region 42 and drain region 44 to form channel region 48. Gate electrode 50 overlies channel region 48. In FIG. 5, the shallow implant regions are located at a second depth less than the depth of said first ion and the concentration of the dopant ions in said shallow implant regions are such that the boundary junction of said shallow implant regions within said semiconductor substrate 12 changes by a factor of 10 within a distance of less than 60 Å, measured at, and perpendicular to, the boundary. In the FET device shown in FIG. 5, the distance between the spaced-apart shallow implanted regions is less than 2500 Å.

The following examples are given to illustrate the scope of the present invention. Because these examples are given for illustrative purposes only, the invention embodied therein should not be limited thereto.

EXAMPLE 1

In this example, <100> n-type silicon wafer with resistivity of about 10 ohm-cm was used for the experiment, the wafer surface was first treated with a Huang clean to remove any surface contaminants. Thermal oxide (5 nm thick) was then grown on the surface at a temperature of about 850° C. This oxide layer is commonly known as screen oxide and is primarily used for reducing contamination during ion implantation.

Some silicon wafers were then implanted with a series of well implants and some silicon wafers were not. The details of the wells implant consist of the following series of ion implantations which were carried out one after the other: antimony, beam energy 190 keV, dose $6\times10^{12}/cm^2$, antimony, beam energy 145 keV, dose $1\times10^{13}/cm^2$, antimony, beam energy 120 keV, dose $1\times10^{13}/cm^2$, phosphorus, beam energy 190 keV, dose $1\times10^{13}/cm^2$, phosphorous, beam energy 120 keV, dose $1\times10^{12}/cm^2$, phosphorous, beam energy 75 keV, dose $1\times10^{12}/cm^2$, phosphorous, beam energy 50 keV, dose $1\times10^{12}/cm^2$, phosphorous, beam energy 20 keV, dose $1\times10^{2}/cm^2$.

After the well implants, the silicon wafers with and without well implants were then preamorphized with germanium ion implant at a beam energy of about 25 keV, dose at $2\times10^{14}/cm^2$ and 7 degree tilt. It is noted that the germanium preamorphization randomizes the silicon substrate and prevents ion channeling of the dopant implant in the subsequent implant. In addition, germanium implant also provides the best preamorphization characteristics which allow fast restore or regrowth of the damaged silicon surface to crystalline order.

Figure 6:
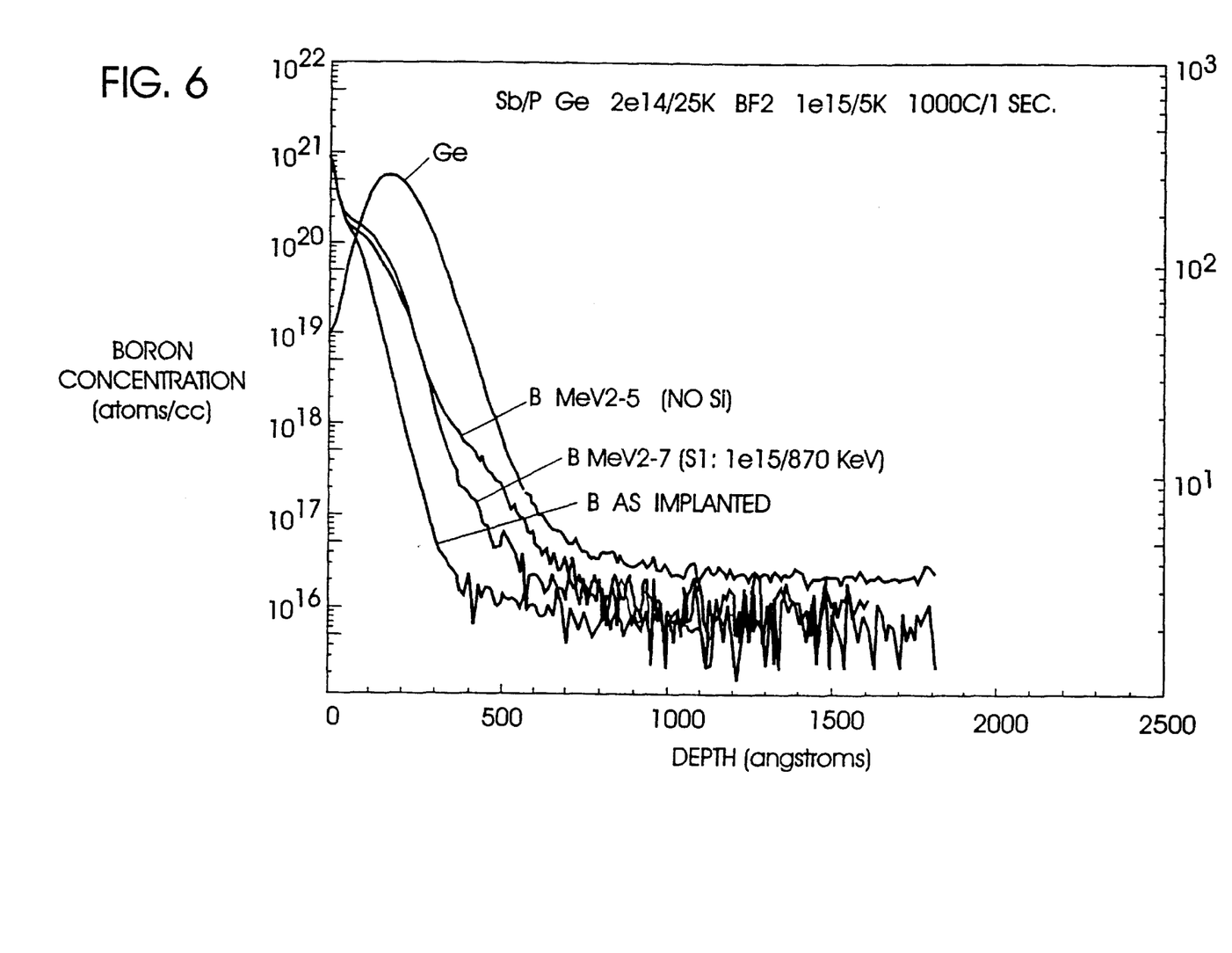
FIG. 6 is a plot of: (left axis) boron concentration (atoms/cc) vs depth (Å); (right axis) Ge relative intensity vs depth (Å).

After preamorphization, all silicon wafers were implanted with $BF_2$ implant at beam energy of 5 keV, dose at $1\times10^{15}/cm^2$ and tilt at 7 degree. The $BF_2$ is the molecular ion source which provides the low energy boron ions at a much higher $BF_2$ implant energy. For example, the 5 keV $BF_2$ beam energy translates to 1.25 keV boron implant energy for shallow as implanted depth before thermal anneal. The sharp as implanted boron dopant profile is illustrated in FIG. 6 for the implant conditions used. As shown, the as-implanted junction depth measured at $1\times10^{18}/cm^3$ boron dopant concentration is 22 nm and the junction slope at the same dopant concentration is about 6 nm per decade change in dopant concentration. No obvious boron ion channeling is observed under these as implanted conditions. After the $BF_2$ shallow implant, all silicon wafers were implanted with high energy silicon implant at energy of either 670, 870 or 1000 keV and a dosage at $1\times10^{15}/cm^2$. Next, all the silicon wafers were treated with a modified Huang clean to remove any contaminants introduced during ion implantation.

The silicon wafers were then annealed with an AG Associates Rapid thermal annealer. The AG annealer is equipped with a tungsten halogen lamp which has sufficient power to raise wafer temperature to 1000° C. or more. The silicon wafer were then annealed one at a time. The rapid thermal anneal conditions were as follows and were identical for each wafers: The wafer was initially at room temperature, the temperature ramp up for the wafer was at 125° C./second, the anneal temperature was at 1000° C., the hold time at the anneal temperature is 1 second, the ramp down rate for the wafer was also set at 125° C./second. The wafer was annealed in the argon atmosphere. ultra-shallow junction was formed after the anneal.

FIG. 6 shows a comparison of the boron dopant profile after the RTA anneal for silicon wafers with and without high energy Si co-implant at a beam energy of 870 keV and $1\times10^{15}/cm^2$ dose. Both wafers have same $BF_2$ shallow implant and antimony/-phosphorous well implants. As can be seen from FIG. 6, the boron dopant profile for the annealed sample without high energy Si co-implant show substantial tail movement below $1\times10^{18}$ dopant concentration, this is indicative of the transient boron dopant diffusion due to excess Si interstitials at the end of range damage of the germanium preamorphization. The junction slope at $1\times10^{18}/cm^3$ dopant concentration is about 90 Å/decade. On the other end, as shown in FIG. 6, the boron dopant profile for the silicon wafer with high energy silicon co-implants show no obvious tail motion at below $1\times10^{18}/cm^3$ dopant concentration. This result clearly demonstrates the effectiveness of the defect interstitial loops generated by the high energy silicon co-implant for sinking the excess silicon interstitials at the end of range damage region and suppressing transient diffusion of the boron dopant.

Transmission microscopy was then performed and it showed both the ultra-shallow junction (about 30 nm in depth) from the silicon substrate surface and the defects loops created by the high energy Si co-implant which was located at about 1 μm below the silicon substrate surface. After RTA anneal, no defects, were observed in the ultra-shallow junction region and full crystallinity of the silicon was restored. The measured sheet resistance of the wafer after the RTA anneal was 500 ohm/squares which indicated good activation of the boron dopant. Table 1 show a summary of all the experimental conditions, i.e., with or without high energy silicon co-implant for different Si implant energies, 670 keV, 870 keV and 1000 keV respectively. It also shows the two cases for silicon wafers with and without well implants. As can be seen, in all cases, high energy silicon co-implants reduces the junction depth and sharpens the junction slope. This clearly demonstrates the usefulness of the method of the present invention for ultra-shallow and sharp junction formation.

TABLE 1

HIGH ENERGY SI CO-IMPLANTS WITH ULTRA-SHALLOW IMPLANTS

| Si co-implants energy (keV) | Co-implant range Rp(um) | Surf. Conc. Sc (cm-3) | Junc. depth Xj at $1 \times 10^{18}$(A) | Xj slope at $1 \times 10^{18}$ (A/decade) |
|---|---|---|---|---|
| WITHOUT WELL IMPLANT | | | | |
| 0 | — | $1.5 \times 10^{20}$ | 365 | 105 |
| 670 | 1.0 | $1.8 \times 10^{20}$ | 320 | 65 |
| 870 | 1.2 | $1.8 \times 10^{20}$ | 345 | 70 |
| 1000 | 1.29 | $1.8 \times 10^{20}$ | 355 | 70 |
| WITH WELL IMPLANT | | | | |
| 0 | — | $1.5 \times 10^{20}$ | 345 | 90 |
| 670 | 1.0 | $1.8 \times 10^{20}$ | 300 | 60 |
| 870 | 1.2 | $1.8 \times 10^{20}$ | 320 | 60 |
| 1000 | 1.29 | $1.8 \times 10^{20}$ | 320 | 65 |

EXAMPLE 2

In this example, the method of the present invention was used to generate a shallow and sharp junction. A <100> n-type silicon wafer was treated with Huang clean to remove the surface contaminants. Thermal oxide 5 nm thick was grown on the silicon substrate surface. The silicon was then preamorphized with germanium implant at 15 keV with a dose of $1.5\times10^{14}$ to create a shallow amorphized layer (20 nm). This was followed by low energy $BF_2$ implant. Since the range of low energy $BF_2$ implant is low, i.e., about 2 nm in oxide, the thermal oxide was stripped away with dilute hydrofluoric acid (i.e., 50:1) just before the low energy implant. The low energy $BF_2$ implant was at 1 keV (which is equivalent to 250 eV boron dopant energy) and dose at $1\times10^{15}/cm^2$, 7 degree tilt.

The silicon wafer was then implanted with high energy Si implant at 670 keV with a dose of $1\times10^{15}/cm^2$ and 7 degree tilt. After implantation, the silicon wafers were treated with modified Huang clean to remove any surface contaminants due to ion implants. The wafers were then RTA annealed with the following fast anneal conditions: Wafer starts at room temperature, temperature ramp up at 125° C./second to the anneal temperature of 1000° C., the time for anneal at 1000° C. was 1 second and the ramp down rate after anneal was at 125° C./second.

Figure 7:
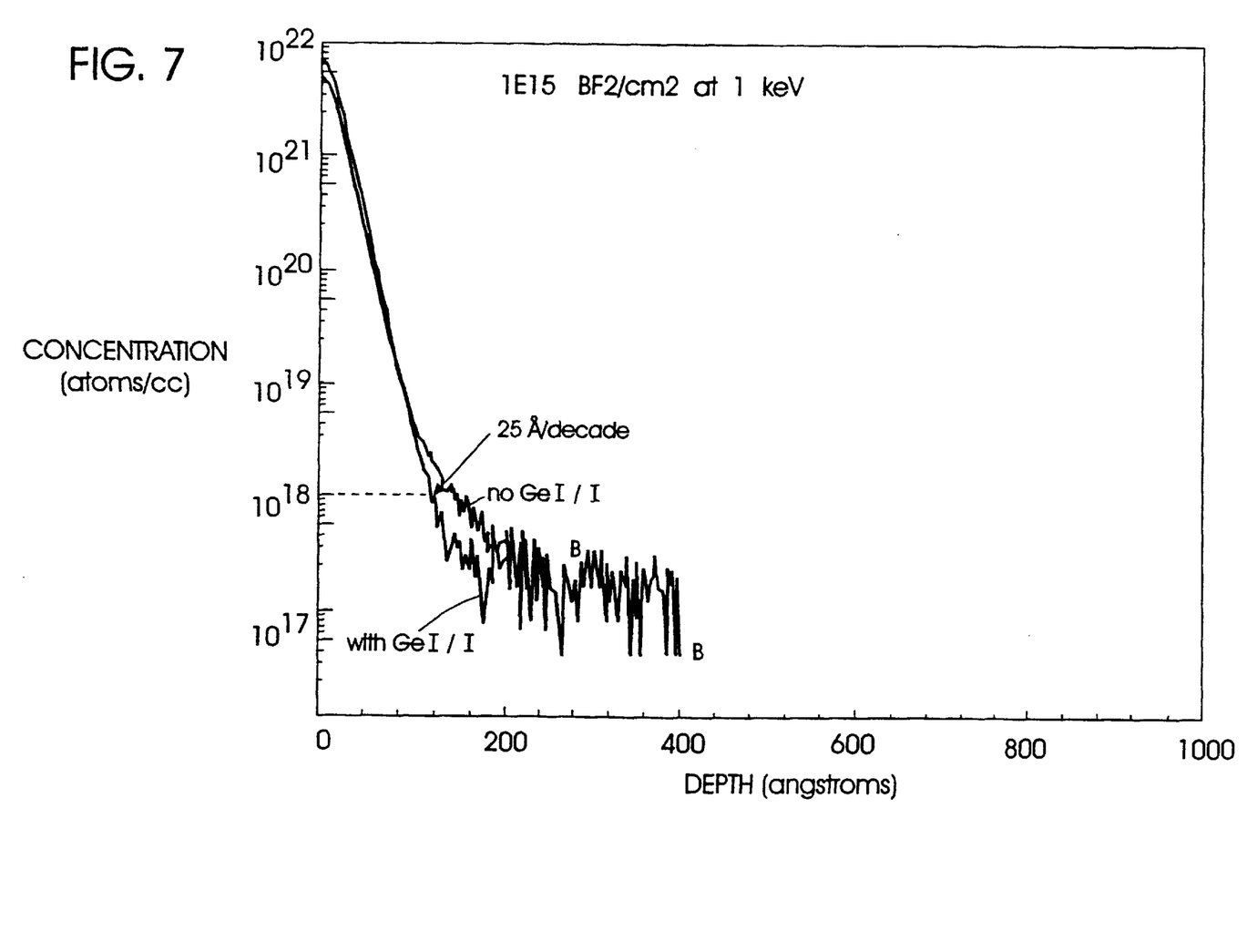
FIG. 7 is a plot of boron concentration (atoms/cc) vs depth (Å).
Figure 8:
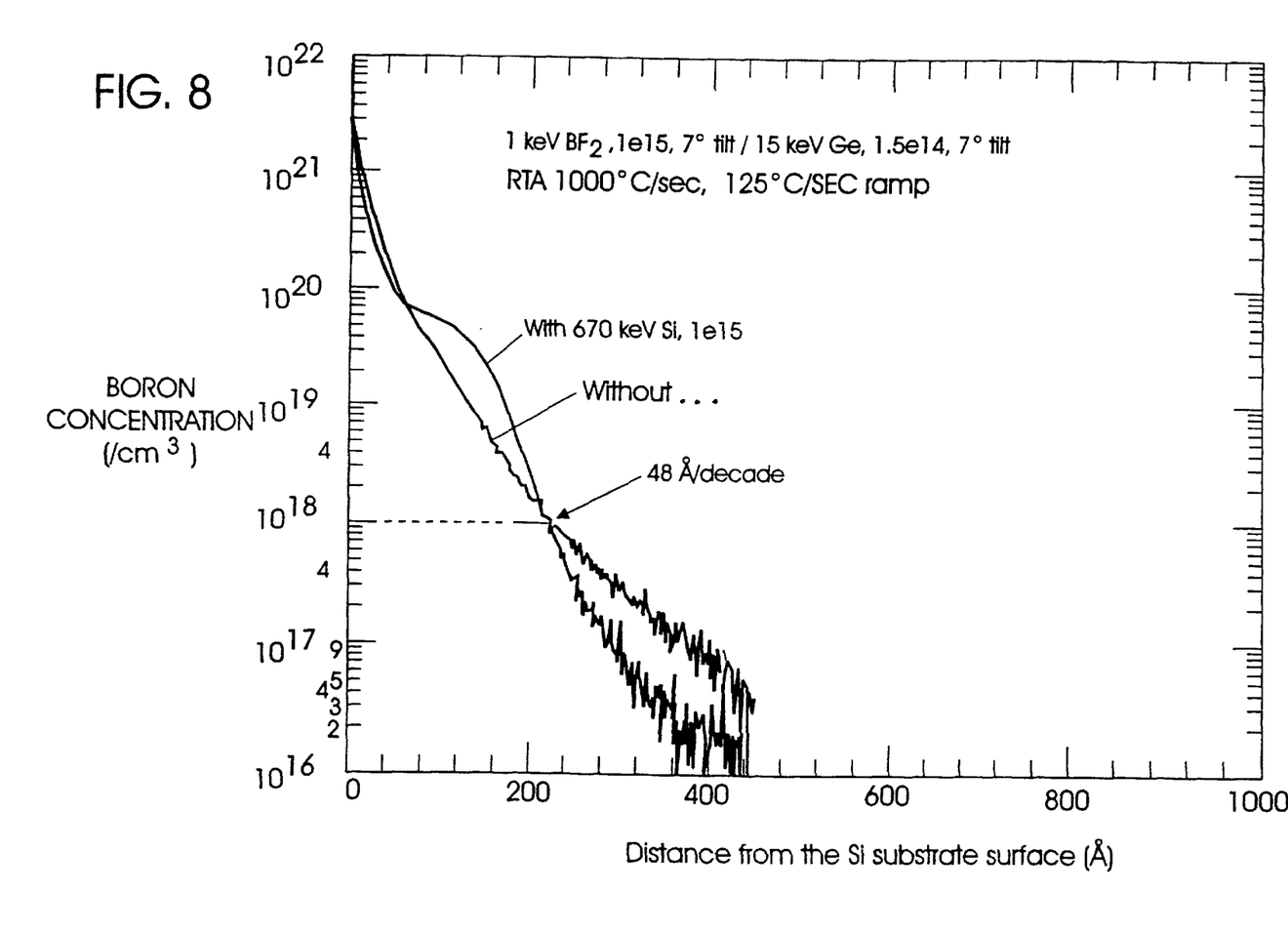
FIG. 8 is a plot of boron concentration (/cm$^3$) vs distance from Si substrate surface (Å).

FIG. 7 shows the dopant as-implanted profile which is shallow (10 nm junction depth at $1\times10^{18}/cm^3$) and sharp (i.e., junction slope at $1\times10^{18}/cm^3$ is 25 Å/decade). FIG. 8 shows a comparison of the dopant profile after anneal with and without high energy silicon co-implants. As can be seen, the dopant profile for the silicon wafer with high energy co-implants is more box like than that without high energy co-implants. Moreover, this box-like dopant profile offers sharper junction slope at $1\times10^{18}$ dopant concentration (i.e., 48 Å/decade vs 60 Å/decade for no high energy co-implants), and comparable ultra-shallow junction depth at $1\times10^{18}/cm^3$ concentration i.e., 20 nm. The box-like dopant profile also offers an additional advantage of lower resistance for the ultra-shallow junction. This combination of germanium preamorphization, ultra-low energy molecular implant, high energy co-implant and fast RTA anneal produce the shallowest and sharpest boron p+ junction ever produced by any prior art techniques.

While the invention has been particularly shown and described with respect to the preferred embodiments thereof, it will be understood by those skilled in the art that the foregoing and other changes in form and detail may be made without departing from the spirit and scope of the invention.

Having thus described my invention, what I claim as new, and desire to secure by Letters Patent is:

1. A structure having an abrupt p-n junction, said structure comprising a shallow implant region defined by dopant material of a first conductivity type formed in a surface of a semiconductor substrate of a second conductivity type, said substrate comprising a region of coalesced high concentrations of interstitial ions of said semiconductor substrate disposed substantially at a first depth, said shallow implant region having a second depth less than said first depth wherein the concentration of said dopant material at a boundary junction of said shallow implant region changes by a factor of 10 within a distance of less than 60 Å measured at, and perpendicular to, said boundary.

2. The structure of in claim 1, wherein said second depth is less than 500 Å.

3. The structure of claim 1, wherein the change of concentration of said dopant material at the boundary junction is measured at a dopant concentration of $1\times10^{18}/cm^2$.

4. The structure of claim 1, wherein said first depth is about 10,000 Å.

5. A field effect transistor comprising a microelectronic device comprising a source region and a drain region formed in mutually spaced adjacency in a surface of a semiconductor substrate, a pair of said shallow implant regions being disposed between and formed as spaced-apart extensions of said source and drain regions to form a channel region between the spaced-apart shallow implant regions, and a gate electrode overlying said channel region, wherein said semiconductor substrate contains regions of coalesced high concentrations of interstitial ions of said semiconductor substrate disposed substantially at a first depth and said shallow implant region having a second depth less than said first depth wherein the concentration of said dopant material at a boundary junction of said shallow implant region changes by a factor of 10 within a distance of less than 60 Å measured at, and perpendicular to, said boundary.

6. The field effect transistor of claim 5, wherein the distance between said spaced-apart shallow implant regions is less than about 2500 Å.

7. The field effect transistor of claim 5, wherein said second depth is less than 500 Å.

8. The field effect transistor of claim 5, wherein the change of concentration of said dopant material at the boundary junction is measured at a dopant concentration of $1\times10^{18}/cm^2$.

9. The field effect transistor of claim 5, wherein said first depth is about 10,000 Å.

* * * * *

UNITED STATES PATENT AND TRADEMARK OFFICE
CERTIFICATE OF CORRECTION

PATENT NO. : 6,037,640
DATED : March 14, 2000
INVENTOR(S) : Kam Leung Lee, et al.

It is certified that error appears in the above-identified patent and that said Letters Patent is hereby corrected as shown below:

On The Title Page, [56] References Cited, U.S. PATENT DOCUMENTS:

"5,512,470" should read --5,512,770--

Signed and Sealed this

Twenty-seventh Day of March, 2001

Attest:

NICHOLAS P. GODICI

Attesting Officer

*Acting Director of the United States Patent and Trademark Office*